(12) United States Patent
Braithwaite

(10) Patent No.: US 6,232,835 B1
(45) Date of Patent: May 15, 2001

(54) SYSTEM AND METHOD OF LINEARIZING THE GAIN ERROR OF A POWER AMPLIFIER

(75) Inventor: Richard Neil Braithwaite, Sunnyvale, CA (US)

(73) Assignee: Nortel Networks Limited, Montreal (CA)

(*) Notice: Subject to any disclaimer, the term of this patent is extended or adjusted under 35 U.S.C. 154(b) by 0 days.

(21) Appl. No.: 09/249,548

(22) Filed: Feb. 12, 1999

Related U.S. Application Data

(60) Provisional application No. 60/074,593, filed on Feb. 13, 1998.

(51) Int. Cl.$^7$ .................... H03F 1/26; H04K 1/02
(52) U.S. Cl. ........................ 330/149; 375/296
(58) Field of Search .................... 330/149, 136, 330/107; 375/296, 297

(56) References Cited

U.S. PATENT DOCUMENTS

| | | | |
|---|---|---|---|
| 3,699,444 | 10/1972 | Ghose et al. | 325/15 |
| 3,900,823 | 8/1975 | Sokal et al. | 330/149 |
| 3,922,617 | 11/1975 | Denniston et al. | 330/149 |
| 4,329,655 | 5/1982 | Nojima et al. | 330/149 |
| 4,389,618 | 6/1983 | Bauman | 330/149 |
| 4,394,624 | 7/1983 | Bauman | 330/149 |
| 4,412,185 | 10/1983 | Gerard | 330/149 |
| 4,560,945 | 12/1985 | Olver | 330/149 |
| 4,580,105 | 4/1986 | Myer | 330/149 |
| 4,879,519 | 11/1989 | Myer | 330/149 |
| 4,885,551 | 12/1989 | Myer | 330/151 |
| 4,926,134 | 5/1990 | Olver | 330/149 |
| 5,023,565 | 6/1991 | Lieu | 330/149 |
| 5,051,704 | 9/1991 | Chapman et al. | 330/149 |
| 5,075,635 | 12/1991 | Boulanger et al. | 330/149 |
| 5,121,077 | 6/1992 | McGann | 330/149 |
| 5,124,665 | 6/1992 | McGann | 330/149 |
| 5,126,687 | 6/1992 | Onoda et al. | 330/149 |
| 5,148,117 | 9/1992 | Talwar | 330/149 |
| 5,155,448 | 10/1992 | Powell | 330/149 |
| 5,157,345 | 10/1992 | Kenington et al. | 330/149 |
| 5,157,346 | 10/1992 | Powell et al. | 330/151 |
| 5,166,634 | 11/1992 | Narahashi et al. | 330/151 |
| 5,291,209 | 3/1994 | Evans et al. | 342/381 |
| 5,323,119 | 6/1994 | Powell et al. | 330/151 |
| 5,489,875 | 2/1996 | Cavers | 330/151 |
| 5,491,454 | 2/1996 | Matz | 330/149 |
| 5,495,502 | 2/1996 | Andersen | 375/235 |
| 5,617,061 | 4/1997 | Fukuchi | 330/151 |
| 5,650,758 | * | 7/1997 | Xu et al. | 330/149 |
| 5,742,201 | * | 4/1998 | Eisenberg et al. | 330/149 |
| 5,748,678 | * | 5/1998 | Valentine et al. | 375/297 |
| 5,760,646 | * | 6/1998 | Belcher et al. | 330/149 |
| 5,768,699 | | 6/1998 | Behan et al. | 455/296 |
| 5,770,971 | * | 6/1998 | McNicol | 330/149 |
| 5,789,976 | * | 8/1998 | Ghannouchi et al. | 330/149 |
| 5,929,703 | * | 7/1999 | Sehier et al. | 330/149 |
| 5,929,704 | * | 7/1999 | Proctor, Jr. et al. | 330/149 |
| 5,990,734 | * | 11/1999 | Wright et al. | 330/149 |
| 6,029,285 | * | 2/2000 | Belcher et al. | 330/149 |
| 6,091,297 | * | 7/2000 | Bear-Davide et al. | 330/149 |
| 6,104,241 | * | 8/2000 | Cova et al. | 330/149 |

\* cited by examiner

*Primary Examiner*—Benny Lee
*Assistant Examiner*—Khanh Van Nguyen

(57) ABSTRACT

A system and method of linearizing the gain error of a power amplifier. The method involves the steps of generating a signal representing a directional derivative in the phase-magnitude space of an error signal of said power amplifier and modulating the gain of said power amplifier with said directional derivative signal.

84 Claims, 6 Drawing Sheets

SYSTEM AND METHOD OF LINEARIZING THE GAIN ERROR OF A POWER AMPLIFIER

This application claims the benefit of priority from U.S. provisional Application Ser. No. 60/074,593 file Feb 13, 1998.

FIELD OF THE INVENTION

The present invention relates to a system and method for linearizing the gain error of a power amplifier. More particularly, the invention relates to directional derivative and gradient methods for estimating and correcting complex gain error.

BACKGROUND OF THE INVENTION

Radio frequency power amplifiers have a nonlinear power transfer function. In other words, both the amplitude and phase components of the amplifier's gain depend on the power of the amplifier's input signal. This amplifier nonlinearity is undesirable because it distorts the output waveform, broadens the output waveform's spectrum, and generates interference within, adjacent channels.

Generally, power amplifier linearization is sought using one of three techniques: vector feedback, adaptive predistortion, and adaptive feedforward compensation. In each of the three techniques, the amplifier's complex gain error must be estimated, preferably in real-time. It is toward this estimation step that the present invention is directed.

Conventionally, the gain error is estimated by comparing the amplifier's output signal with a reference signal, usually the amplifier's input signal. This comparison measures quantities such as the correlation or the error power of the two signals.

Unfortunately, conventional correlation circuits introduce DC offsets and common-mode feedthrough errors. Also problematic, conventional error power measurement circuits use a search process that disturbs the gain along the amplification path and yields a signal convergence that is too slow for vector feedback systems.

It would be desirable to have a gain error estimator that does not suffer from these problems.

SUMMARY OF THE INVENTION

The illustrated embodiments avoid conventional common-mode feedthrough problems by measuring the error signal across a single square-law detector in a single processing path.

Instead of conventionally varying the gain along the amplifier path to search for the minimum error, the embodiments vary the amplitude and/or phase along a reference path. In other words, differential measurements needed to estimate the gain error gradient are obtained by amplitude and/or phase modulating the reference signal. The modulated error power measurement is later demodulated, so that the amplifier gain is unaffected by the search process.

Although modulating the reference signal is only a one-dimensional search of the amplitude phase ($\delta a$–$\delta \phi$) space, by implementing two concurrent (and preferably orthogonal) searches, one can resolve the gain error gradient from the directional derivatives obtained.

Thus, according to one embodiment of the invention, there is provided a method of linearizing the vector gain of a power amplifier including generating a directional derivative signal representing a phase-amplitude space directional derivative of an error signal of the power amplifier and modulating the gain of the power amplifier in response to the directional derivative signal. Generating a directional derivative signal might include locating in the phase-amplitude space of the error signal a vector that is substantially equal to the directional derivative. By extension, locating a vector that is substantially equal to the directional derivative might include searching for the best approximation of the directional derivative along a bounded one-dimensional path in the phase-amplitude space of the error signal.

Alternatively, locating a vector that is substantially equal to the directional derivative might include: searching for the best approximation of the directional derivative along a bounded one-dimensional path in the phase-amplitude space of the error signal, the path being parallel to the phase axis of the phase-amplitude space; searching for the best approximation of the directional derivative along two bounded one-dimensional paths in the phase-amplitude space of the error signal; searching for the best approximation of the directional derivative along two substantially orthogonal bounded one-dimensional paths in the phase-amplitude space of the error signal; searching for the best approximation of the directional derivative alternately along each of two substantially orthogonal bounded one-dimensional paths in the phase-amplitude space of the error signal; searching for the best approximation of the directional derivative simultaneously along each of two substantially orthogonal bounded one-dimensional paths in the phase-amplitude space of the error signal and then combining into a weighted average the best approximation of the directional derivative along each of the two substantially orthogonal bounded one-dimensional paths; or searching at a first frequency for a first component of the best approximation of the directional derivative along a first bounded one-dimensional path in the phase amplitude space of the error signal and then searching at a second frequency for a second component of the best approximation of the directional derivative along a second bounded one-dimensional path in the phase amplitude space of the error signal.

Desirably, the method includes: receiving a feedback signal corresponding to an output signal output from the power amplifier, receiving a reference signal corresponding to an input signal input to the power amplifier, modulating the phase of the reference signal through a bounded range of phase shift angles, subtracting the feedback signal from the modulated reference signal to produce a difference signal, and rectifying the difference signal to produce a rectified difference signal that corresponds to the magnitude of a directional derivative oriented parallel to the phase-amplitude space phase axis.

Alternatively, the method might include generating a gradient signal representing a phase-amplitude space gradient of the error signal of the power amplifier. In this case, the method desirably further includes: receiving a feedback signal corresponding to an output signal output from the power amplifier, receiving a reference signal corresponding to an input signal input to the power amplifier, modulating the phase of the reference signal through a bounded range of phase shift angles, modulating the amplitude of the reference signal through a bounded range of amplitude shift levels, subtracting the feedback signal from the modulated reference signal to produce a difference signal, and rectifying the difference signal to produce a rectified difference signal that corresponds to the magnitude and phase of the gradient signal.

Still alternatively, generating the gradient signal might include: receiving a feedback signal corresponding to an output signal output from the power amplifier, receiving a reference signal corresponding to an input signal input to the power amplifier, subtracting the magnitude of the feedback signal from the magnitude of the reference signal to produce an amplitude component of the gain error gradient, modulating the phase of the reference signal through a bounded range of phase shift angles, subtracting the feedback signal from the modulated reference signal to produce a difference signal, rectifying the difference signal to produce a rectified difference signal that corresponds to a phase component of the gradient signal.

It should be added that either generating a directional derivative signal or generating a gradient signal might further include; attenuating the output signal by the nominal gain of the amplifier, time delaying the input signal by the loop delay of the amplifier, demodulating the rectified difference signal to produce a demodulated difference signal, lowpass filtering the demodulated difference signal to produce a filtered difference signal, or normalizing the filtered difference signal with respect to the instantaneous power of the reference signal to produce a normalized signal.

According to another embodiment of the invention, there is provided means for linearizing the vector gain of a power amplifier including means for generating a directional derivative signal representing a phase-amplitude space directional derivative of an error signal of the power amplifier and means for modulating the gain of the power amplifier in response to the directional derivative signal.

According to yet another embodiment of the invention, there is provided an apparatus for linearizing the vector gain of a power amplifier having an input terminal, an output terminal, and a gain control terminal, the apparatus including a derivative signal generator having: a first input stage connected to the power amplifier input terminal to produce a reference signal corresponding to an input signal input to the power amplifier; a second input stage connected to the power amplifier output terminal to produce a feedback signal corresponding to an output signal output from the power amplifier; and an output stage connected to the power amplifier gain control terminal to provide a directional derivative signal representing a phase-amplitude space directional derivative of the power amplifier gain error.

While specific embodiments of the invention are described and illustrated, such embodiments should be considered illustrative of the invention only and not as limiting the invention as construed in accordance with the accompanying claims.

BRIEF DESCRIPTION OF THE DRAWINGS

In drawings which illustrate embodiments of the invention.

DETAILED DESCRIPTION

Overview

A power amplifier has a nominal complex gain $G_o$, which includes both amplitude and phase components. In practice however, the amplifier's actual gain G differs from the nominal gain $G_o$ and instead varies with the power of the amplifier's input signal $X_{in}$.

The amplifier's complex gain error $(G/G_o)-1$ is defined with reference to its nominal gain and its actual gain. To linearize the amplifier, one must converge the gain error to zero. Estimating the instantaneous gain error approximates the necessary gain adjustment for amplifier linearization.

The gain error's gradient is the most direct path to the error minimum. In this case, the gain error gradient is equivalent to the instantaneous gain error itself. Although the gain error gradient is the most direct convergence path, for circuit implementation reasons one may instead choose to converge along other directional derivatives.

Six embodiments of a system for estimating the gain error of a power amplifier are disclosed. Each embodiment converges the gain error along at least one directional derivative, in some embodiments the gain error gradient.

The invention may be incorporated into adaptive predistortion and adaptive feedforward compensation networks. However, for simplicity, all embodiments discussed are directed to vector feedback networks connected to control a vector modulated power amplifier.

FIG. 1

Figure 1:
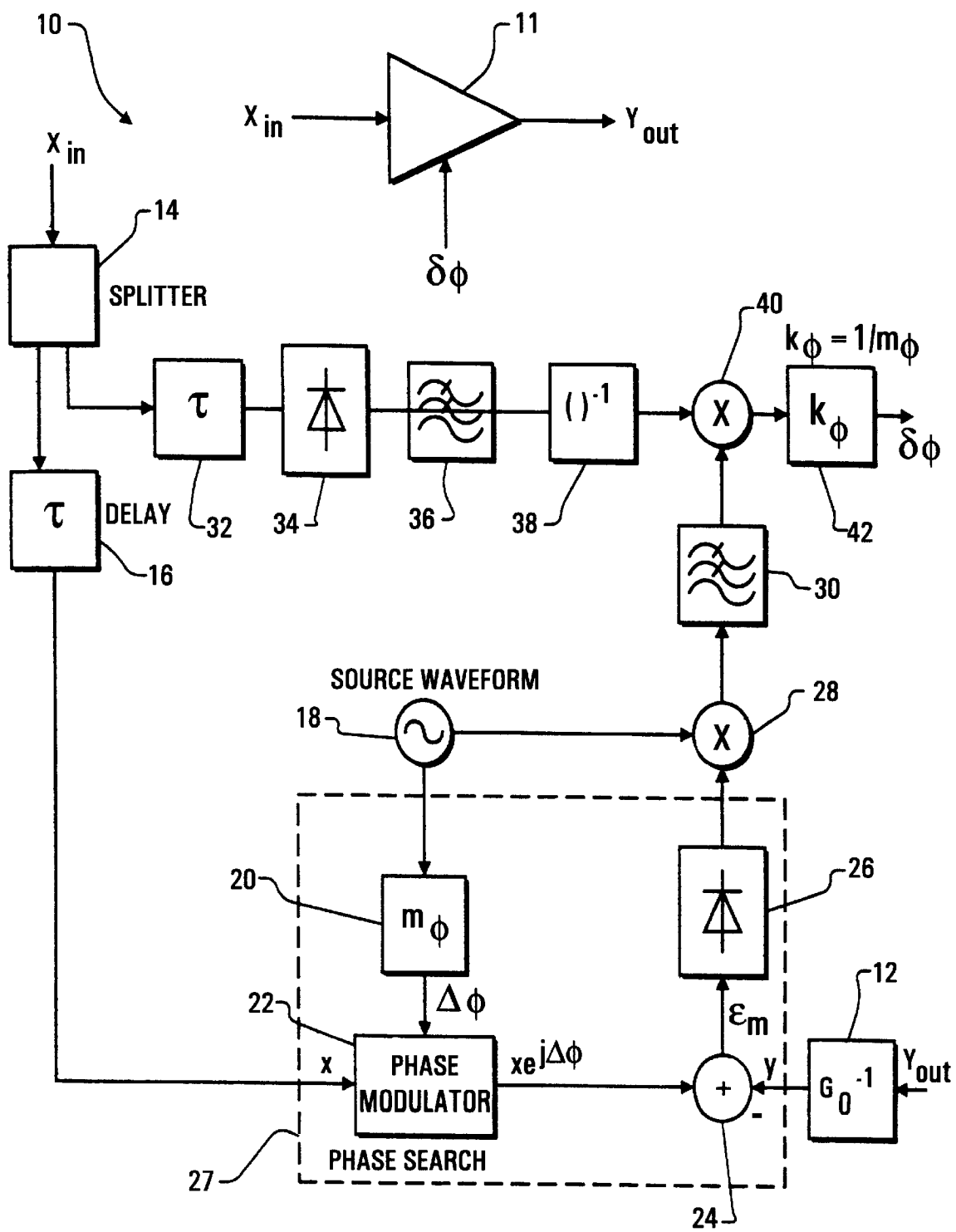
FIG. 1 is a schematic diagram of a phase error estimator according to a first embodiment of the invention.

Referring now to FIG. 1, a phase error estimator embodying a first aspect of the invention is generally illustrated at 10. The phase error estimator 10 is connected to control a vector modulated power amplifier 11 having a nominal gain $G_o$ and an actual gain G.

The phase error estimator 10 is connected to the amplifier 11 to receive both its input signal $X_{in}$ and its output signal $Y_{out}$. The phase error estimator 10 is also connected to feedback to the amplifier 11 a gain-modulating error signal $\delta\phi$ that represents the phase component of the amplifier's complex gain error $(G/G_o)-1$. The estimated phase error may be viewed as an estimated directional derivative oriented parallel to the phase coordinate axis.

In greater detail now, an attenuator 12 is connected to the amplifier 11 to sample its output signal $Y_{out}$ and to attenuate it by the nominal gain $G_o$ to produce an attenuated feedback signal y.

A splitter 14 is connected to the amplifier 11 to sample its input signal $X_{in}$. A first time delay loop 16 is connected to the splitter 14 to receive the sampled input signal $X_{in}$, and to produce in response a time-delayed reference signal x by introducing a time delay τ equal to the delay time through the amplifier 11 and around the feedback loop to the attenuator 12 output terminal.

A waveform source 18 is connected through a first scalar multiplier 20 to control a phase modulator 22. The phase modulator 22 has an input terminal, an output terminal, and a control terminal, to which the scalar multiplier 20 is connected. The phase modulator 22 introduces a phase shift between its input and output terminals in response to the signal amplitude at its control terminal.

The waveform source 18 may produce any arbitrary periodic waveform; however, a constant amplitude, constant frequency sine wave having the form $\sin(\omega_\varnothing t)$ is preferred. The first scalar multiplier 20 scales the amplitude of the waveform source signal by a predetermined value $m_\varnothing$ to yield a scaled waveform having the form $\Delta\varnothing = m_\varnothing \cdot \sin(\omega_\varnothing t)$. The scaled waveform determines the phase-shifting range of the phase modulator 22.

The input terminal of the phase modulator 22 is connected to the first time delay loop 16 to receive the time delayed reference signal x. The output terminal of the phase modulator produces a phase modulated reference signal $x \cdot e^{j\Delta\varnothing}$. This modulation of the reference signal x enables a rolling range of phase angles to be searched to determine which yields the lowest gain error.

A summing junction 24 is connected to the attenuator 12 and the phase modulator 22 to subtract the attenuated feedback signal y from the phase modulated reference signal $x \cdot e^{j\Delta\varnothing}$ to produce a modulated error signal $\epsilon_m = X \cdot e^{j\Delta\varnothing} - y$.

A first square-law detector 26 is connected to the summing junction 24 to receive the modulated error signal $\epsilon_m$ and to produce at its output terminal a signal proportional to the power of the error signal $|\epsilon_m|^2$.

The module formed by the interconnection of the first scalar multiplier 20, the phase modulator 22, the summing junction 24, and the first square-law detector 26 will hereafter be termed a phase search module 27. Essentially, the phase search module searches for the phase adjustment that yields the lowest error power signal $|\epsilon_m|^2$. Thus the phase search module provides for searching for the best approximation of the directional derivative along a bounded one-dimensional path in the phase-amplitude space of the error signal, the path being parallel to the phase axis of the phase-amplitude space.

A demodulator 28 is connected at a first input terminal to the waveform source 18 and at a second input terminal to the output terminal of the first square-law detector 26. The demodulator 28 removes the source waveform component from the error power signal $|\epsilon_m|^2$.

A first lowpass filter 30 is connected to the demodulator 28 to receive the demodulated error power signal to remove any modulation harmonics and DC offset appearing at the output of the first square-law detector 26.

A second time delay loop 32 is connected to the splitter 14 to receive the sampled amplifier input signal $X_{in}$. The second time delay loop 32 introduces a time delay $\tau$ equal to the delay time through the amplifier 11 and around the feedback loop to the attenuator 12 output terminal, thereby producing a second instance of the time delayed reference signal x.

The second time delay loop 32 is connected to feed in series a second square-law detector 34, a second lowpass filter 36, and an inverter 38, which in combination produce a normalizing signal $1/|x|^2$.

A mixer 40 is connected to the inverter 38 to receive the normalizing signal $1/|x|^2$ and to the first lowpass filter 30 to receive the filtered and demodulated error power signal $|\epsilon_m|^2$. The mixer 40 produces in response a normalized error power signal $|\epsilon_m|^2/|x|^2$.

A second scalar multiplier 42 is connected to the mixer 40 to receive the normalized error power signal $|\epsilon_m|^2/|x|^2$ and scale it by the reciprocal of the first scalar multiplier 20, $k_\varnothing = 1/m_\varnothing$. This scaling operation compensates for the sensitivity increase introduced by the first scalar multiplier 20 and generates the estimated phase component of the gain error $\delta\varnothing$. The second scalar multiplier 42 is connected to the amplifier 11 to modulate its gain by the estimated phase component of the gain error $\delta\varnothing$.

Thus, the phase error estimator 10 provides for searching for the beat approximation of the directional derivative along a bounded one-dimensional path in the phase-amplitude space of the error signal, the path being parallel to the phase axis of the phase-amplitude space.

FIG. 2

Figure 2:
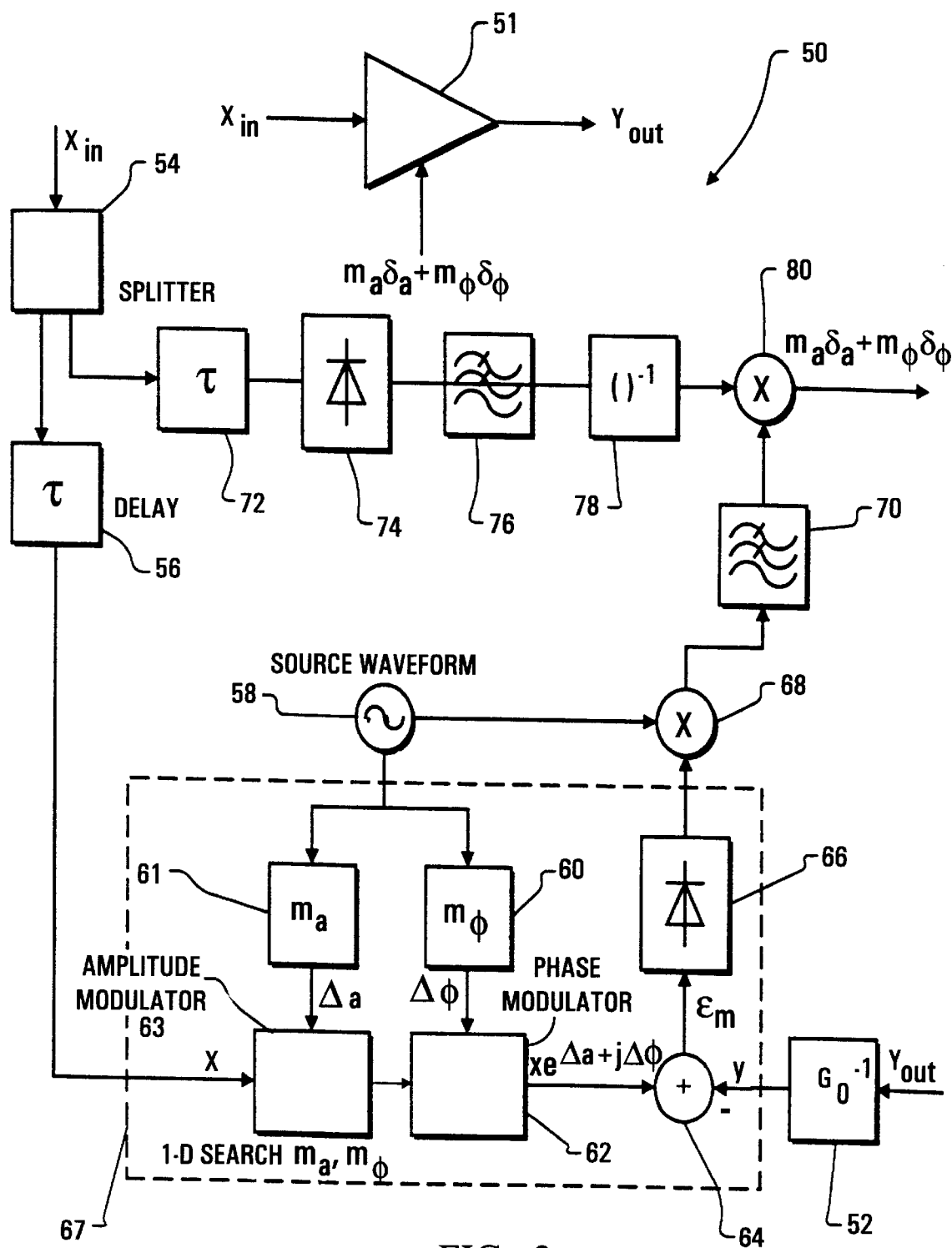
FIG. 2 is a schematic diagram of a directional derivative estimator according to a second embodiment of the invention.

Referring now to FIG. 2, a directional derivative estimator according to a second embodiment of the invention is generally illustrated at 50. The directional derivative estimator 50 is connected to control a vector modulated power amplifier 51 having a nominal gain $G_o$ and an actual gain G.

The directional derivative estimator 50 is connected to the amplifier 51 to receive both its input signal $X_{in}$ and its output signal $Y_{out}$. The directional derivative estimator 50 is also connected to feedback to the amplifier 51 a gain modulating error signal $(m_a \cdot \delta_a + m_\varnothing \cdot \delta_\varnothing)$ that represents the amplifier's complex gain error $(G/G_o) - 1$.

In greater detail now, an attenuator 52 is connected to the amplifier 51 to sample its output signal $Y_{out}$ and to attenuate it by the nominal gain $G_o$ to produce an attenuated feedback signal y.

A splitter 54 is connected to the amplifier 51 to sample its input signal $X_{in}$. A first time delay loop 56 is connected to the splitter 54 to receive the sampled input signal $X_{in}$ and to produce in response a time-delayed reference signal x by introducing a time delay $\tau$ equal to the delay time through the amplifier 51 and around the feedback loop to the attenuator 52 output terminal.

A waveform source 58 is connected through a first scalar multiplier 60 to control a phase modulator 62 and connected through a second scalar multiplier 61 to control an amplitude modulator 63.

The phase modulator 62 has an input terminal, an output terminal, and a control terminal, to which the first scalar multiplier 60 is connected. The phase modulator 62 introduces a phase shift between its input and output terminals in response to the signal amplitude at its control terminal. Thus the phase modulator 62 provides for modulating the phase of the reference signal through a bounded range of phase shift angles.

The amplitude modulator 63 has an input terminal, an output terminal, and a control terminal, to which the second scalar multiplier 61 is connected. The amplitude modulator 63 scales amplitude between its input and output terminals in response to the signal amplitude at its control terminal. Thus the amplitude modulator 63 provides for modulating the amplitude of the reference signal through a bounded range of amplitude shift levels.

The waveform source 58 may produce any arbitrary periodic waveform; however, a constant amplitude, constant frequency sine wave having the form $\sin(\omega_{526} t)$ is preferred.

The first scalar multiplier 60 scales the amplitude of the waveform source signal by a predetermined value $m_\varnothing$ to yield a scaled waveform having the form $\Delta\varnothing = m_\varnothing \cdot \sin(\omega_\varnothing t)$. This scaled waveform sets the phase-shifting range of the phase modulator 62.

The second scalar multiplier 61 scales the amplitude of the waveform source signal by a predetermined value $m_a$ to yield a scaled waveform having the form $\Delta a = m_a \cdot \sin(\omega_o t)$. This scaled waveform determines the amplitude scaling range of the amplitude modulator 63, The phase modulator 62 and the amplitude modulator 63 are connected in series to the output terminal of the first time delay loop 56 to receive the time delayed reference signal x. In combination, they produce a phase and amplitude modulated reference signal $x \cdot e^{\Delta a + j \Delta \phi}$. This modulation of the reference signal x enables a rolling range of amplitudes and phase angles to be searched to determine which yields the lowest gain error. The fixed ratio $-(m_a/m_\phi)$ sets the trajectory of that search.

A summing junction 64 is connected to the attenuator 52 and the phase modulator 62 to subtract the attenuated feedback signal y from the modulated reference signal $x \cdot e^{\Delta a + j \Delta \phi}$ to produce a modulated error signal $\epsilon_m = x \cdot e^{\Delta a + j \Delta \phi} - y$.

A first square-law detector 66 is connected to the summing junction 64 to receive the modulated error signal $\epsilon_m$ and to produce at its output terminal a signal proportional to the power of the error signal $|\epsilon_m|^2$. Thus the first square-law detector 66 provide for rectifying the difference signal to produce a rectified difference signal that corresponds to the magnitude of a directional derivative oriented parallel to the phase-amplitude space phase axis.

The module formed by the interconnection of the first scalar multiplier 60, the phase modulator 62, the second scalar multiplier 61, the amplitude modulator 63, the summing junction 64, and the first square-law detector 66 will hereafter be termed a one-dimensional search module 67. The one-dimensional search module 67 searches along a trajectory having slope $-(m_a/m_\phi)$ for the amplitude and phase adjustments that yield the lowest error power signal $|\epsilon_m|^2$. Thus the one-dimensional search module 67 provides for locating in the phase-amplitude space of the error signal a vector that is substantially equal to the directional derivative. Furthermore, the one-dimensional search module 67 provides for searching for the best approximation of the directional derivative along a bounded one-dimensional path in the phase-amplitude space of the error signal.

A demodulator 68 is connected at a first input terminal to the waveform source 58 and at a second input terminal to the output terminal of the first square-law detector 66. The demodulator 68 removes the source waveform component from the error power signal $|\epsilon_m|^2$.

A first lowpass filter 70 is connected to the demodulator 68 to receive the demodulated error power signal to remove any modulation harmonics and DC offset appearing at the output of the first square-law detector 66.

A second time delay loop 72 is connected to the splitter 54 to receive the sampled amplifier input signal $X_{in}$. The second time delay loop 72 introduces a time delay $\tau$ equal to the delay time through the amplifier 51 and around the feedback loop to the attenuator 52 output terminal, thereby producing a second instance of the time delayed reference signal x.

The second time delay loop 72 is connected to teed in series a second square-law detector 74, a second lowpass filter 76, and an inverter 78, which in combination produce a normalizing signal $1/|x|^2$.

A mixer 80 is connected to the inverter 78 to receive the normalizing signal $1/|x|^2$ and to the first lowpass filter 70 to receive the filtered and demodulated error power signal $|\epsilon_m|^2$. The mixer 80 produces in response a normalized error power signal $|\epsilon_m|^2/|x|^2$, which is a directional derivative of the gain error. The mixer 80 is connected to the amplifier 51 to modulate its gain by the estimated directional derivative $m_a \cdot \delta_a + m_\phi \cdot \phi_\phi$ of the gain error. Thus the directional derivative estimator 50 provides for generating a directional derivative signal representing a phase-amplitude space directional derivative of an error signal of the power amplifier and modulating the gain of the power amplifier in response to the directional derivative signal.

FIG. 3

Figure 3:
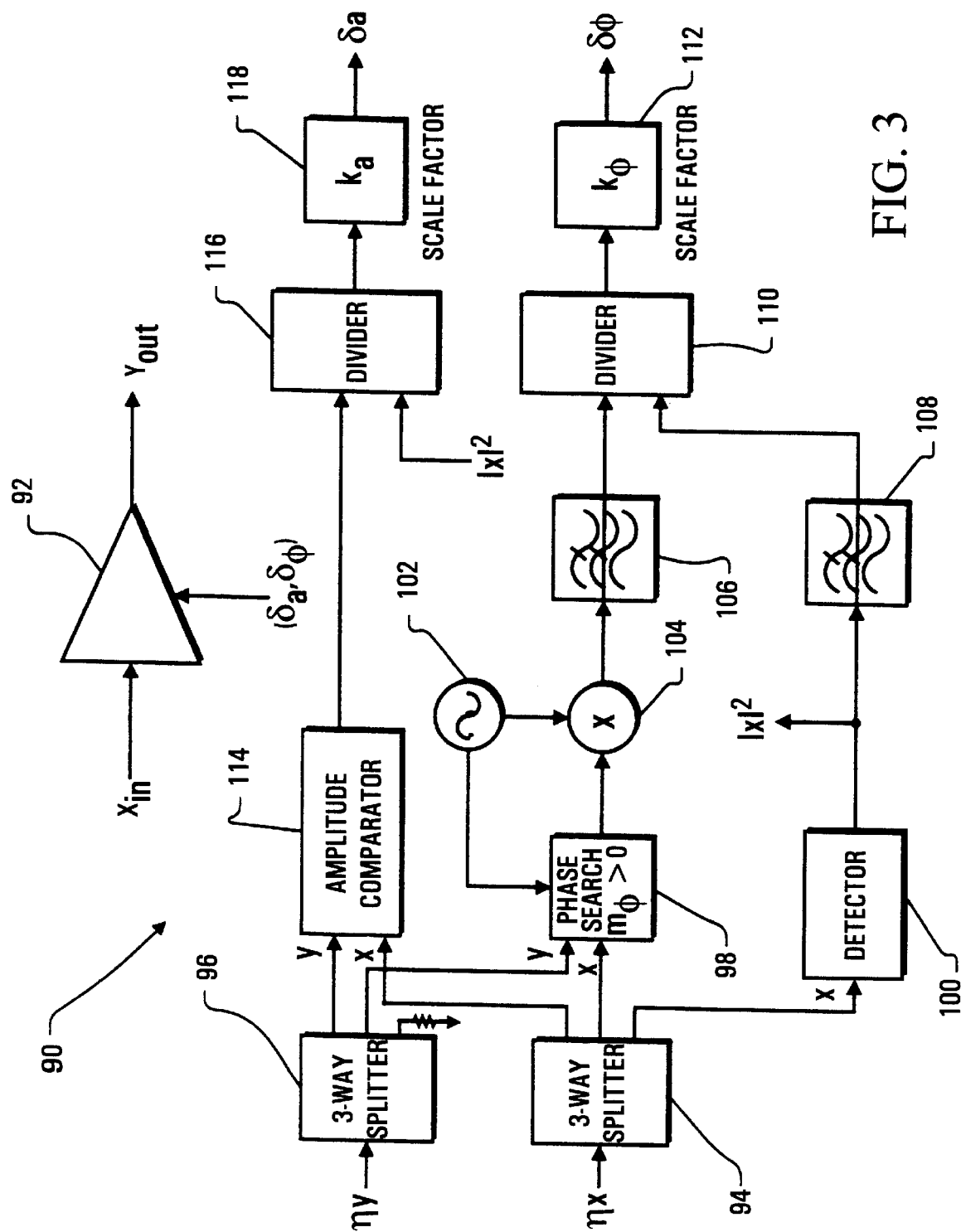
FIG. 3 is a schematic diagram of a gain error estimator according to a third embodiment of the invention, the embodiment including a phase error estimator as shown in FIG. 1.

Referring now to FIG. 3, an error gradient estimator according to a third embodiment of the invention is generally illustrated at 90. The error gradient estimator 90 is connected to a vector modulated power amplifier 92 having a nominal gain $G_o$, an actual gain G, and being connected to receive an input signal $X_{in}$ and transmit an output signal $Y_{out}$.

It may be observed that the error gradient estimator 90 includes a phase error estimator as illustrated at 10 in FIG. 1.

The error gradient estimator 90 is connected to the amplifier 92 through appropriate splitters, time delay loops, and attenuators as described in FIGS. 1 and 2 to receive a time delayed reference signal $x(t) = X_{in}(t-\tau)$ and an attenuated feedback signal $y = G_o^{-1} \cdot Y_{out}$. The error gradient estimator 90 is also connected to feedback to the amplifier 132 a gain-modulating error signal ($\delta a, \delta \phi$) that represents the gradient of the amplifier's complex gain error $(G/G_o) - 1$.

In greater detail now, a first three-way splitter 94 is connected to receive from the amplifier 92 the time delayed input signal x. A second three-way splitter 96 is connected to receive from the amplifier 92 the attenuated feedback signal y.

A phase search module 98, which was shown in greater detail at 27 in FIG. 1, is connected to the first and second three-way splitters 94, 96 to receive the time-delayed reference signal x and the attenuated feedback signal y. A square-law detector 100 is similarly connected to the first three-way splitter to receive the time-delayed reference signal x.

The phase search module 98 and the square-law detector 100 are assembled according to the embodiment of FIG. 1 along with a waveform source 102, a demodulator 104, a first lowpass filter 106, a second lowpass filter 108, a first normalizing divider 110, and a scalar multiplier 112 to form a phase error estimator that yields an estimated phase error $\delta \phi$.

An amplitude comparator 114 is connected to the first and second three-way splitters 94, 96 to receive the time-delayed reference signal x and the attenuated feedback signal y and to produce in response a difference signal. A second normalizing divider 116 is connected to receive the difference signal from the amplitude comparator 114 and the reference power signal from the square-law detector 100 in order to divide the former by the latter.

A scalar multiplier 118 is connected to receive the normalized signal from the second normalizing divider 116 and to multiply it by a scalar constant $k_a = 0.5$ to yield an estimated amplitude error $\delta a$.

Thus the error gradient estimator 90 provides a gradient signal generator, a first input stage connected to the power amplifier input terminal to produce a reference signal corresponding to an input signal input to the power amplifier, a second input stage connected to the power amplifier output terminal to produce a feedback signal corresponding to an output signal output from the power amplifier, an output stage connected to the power amplifier gain control terminal to provide a directional derivative signal representing a phase-amplitude space directional derivative of the power amplifier gain error, a first subtracting junction connected to the first and second input stages to subtract the magnitude of the feedback signal from the magnitude of the reference signal to produce an amplitude component of the gain error gradient, a phase modulator connected to the first input stage to modulate the phase of the reference signal through a bounded range of phase shift angles, a second subtracting junction connected to the phase modulator and the second input stage to subtract the feedback signal from the modulated reference signal to produce a difference signal, and a rectifier connected to the subtracting junction to rectify the difference signal to produce a rectified difference signal that corresponds to a phase component of the gradient signal. In this manner, the error gradient estimator 90 generates a signal representing an estimated error gradient.

FIG. 4

Figure 4:
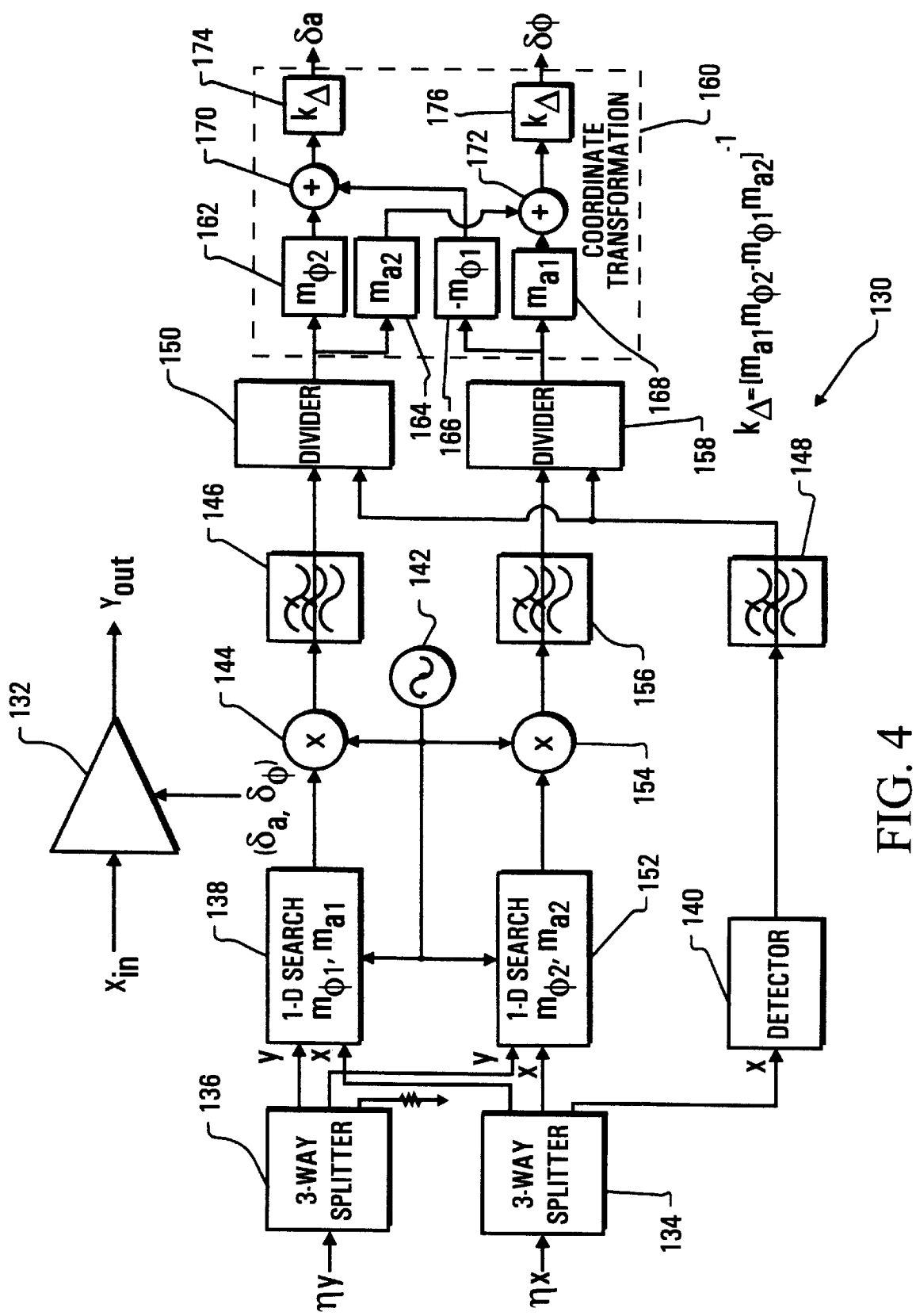
FIG. 4 is a schematic diagram of a gain error estimator according to a fourth embodiment of the invention, the embodiment including two of the directional derivative estimators shown in FIG. 2.

Referring now to FIG. 4, an error gradient estimator according to a fourth embodiment of the invention is generally illustrated at 130. The error gradient estimator 130 is connected to a vector modulated power amplifier 132 having a nominal gain $G_o$, an actual gain G, and being connected to receive an input signal $X_{in}$ and transmit an output signal $Y_{out}$.

It may be observed that the error gradient estimator 130 includes two interdependent directional derivative estimators as illustrated at 50 in FIG. 2.

The error gradient estimator 130 is connected to the amplifier 132 through appropriate splitters, time delay loops, and attenuators as described in FIGS. 1 and 2 to receive a time delayed reference signal $x(t)=X_{in}(t-\tau)$ and an attenuated feedback signal $y=G_o^{-1} \cdot Y_{out}$. The error gradient estimator 130 is also connected to feedback to the amplifier 92 a gain modulating error signal ($\delta a, \delta \varnothing$) that represents the gradient of the amplifier's complex gain error $(G/G_o)-1$.

In greater detail now, a first three-way splitter 134 is connected to receive from the amplifier 132 the time delayed input signal x. A second three-way splitter 136 is connected to receive from the amplifier 132 the attenuated feedback signal y.

A first one-dimensional search module 138 is connected to the first and second three-way splitters 134, 136 to receive the time-delayed reference signal x and the attenuated feedback signal y. The first one-dimensional search module 138 has preset search-trajectory constants $m_{\varnothing 1}$ and $m_{a1}$.

A square-law detector 140 is also connected to the first three-way splitter to receive the time-delayed reference signal x.

The first one-dimensional search module 138 and the square-law detector 140 are assembled according to the embodiment of FIG. 2 with a waveform source 142, a first demodulator 144, a first lowpass filter 146, a second lowpass filter 148, and a first normalizing divider 150, to form a first directional derivative estimator. second one-dimensional search module 152 is connected to he first and second three-way splitters 134, 136 to receive the time-delayed reference signal x and the attenuated feedback signal y. The second one-dimensional search module 152 has preset search-trajectory constants $m_{\varnothing 2}$ and $m_{a2}$. Preferably, the search-trajectory constants $m_{\varnothing 1}$ and $m_{a1}$ and $m_{\varnothing 2}$ and $m_{a2}$ are selected such that the search-trajectories of the first and second one-dimensional search modules 138, 152 are orthogonal.

The second one-dimensional search module 152 and the square-law detector 140 are assembled according to the embodiment of FIG. 2 with the waveform source 142, a second demodulator 154, a third lowpass filter 156, the second lowpass filter 148, and a second normalizing divider 158, to form a second directional derivative estimator.

Thus, together the first and second one-dimensional search modules 138, 152 provide for searching for the best approximation of the directional derivative along two bounded one-dimensional paths in the phase-amplitude space of the error signal. Furthermore, they provide for searching f or the beat approximation of the directional derivative along two substantially orthogonal bounded one dimensional paths in the phase-amplitude space of the error signal. In effect, the first and second one-dimensional search modules 138, 152 function as sweep circuits, each sweeping its one-dimensional path in phase-amplitude space for the best approximation of the directional derivative.

A coordinate transform network 160 is connected to receive the signals output from the first and second normalizing dividers 150, 158 in order to extract the gain error gradient from the two directional derivatives. The coordinate transform network 160 includes first, second, third and fourth scalar multipliers 162, 164, 166, 168. The first scalar multiplier 162 is connected to receive the signal output from the first normalizing divider 150 and to multiply it by $m_{\varnothing 2}$. The second scalar multiplier 164 is connected to receive the signal output from the first normalizing divider 150 and to multiply it by $m_{a2}$. The third scalar multiplier 166 is connected to receive the signal output from the second normalizing divider 158 and to multiply it by $--m_{\varnothing 1}$. The fourth scalar multiplier 168 is connected to receive the signal output from the second normalizing divider 158 and to multiply it by $m_{a1}$.

The coordinate transform network 160 also includes first and second summing junctions 170, 172. The first summing junction 170 is connected to receive the signals output from the first and third scalar multipliers 162, 166. The second summing junction 172 is connected to receive the signals output from the second and fourth scalar multipliers 164, 168.

Thus together the first and second one-dimensional search modules 138, 152 and the coordinate transform network 160 provide for searching for the best approximation of the directional derivative simultaneously along each of two substantially orthogonal bounded one-dimensional paths in the phase-amplitude space of the error signal and combining into a weighted average the best approximation of the directional derivative along each of the two substantially orthogonal bounded one-dimensional paths.

The coordinate transform network 160 further includes fifth and sixth scalar multipliers 174, 176. The fifth scalar multiplier 174 is connected to receive the signal output from the first summing junction 170 and to multiply it by the scalar $k_A=[m_{a1} \cdot m_{\varnothing 2}-m_{\varnothing 1} \cdot m_{a2}]^{-1}$ thereby yielding an estimate of the amplitude component $\delta a$ of the gain error gradient. The sixth scalar multiplier 176 is connected to receive the signal output from the second summing junction 172 and to multiply it by the $k_A$ thereby yielding an estimate of the phase component $\delta \varnothing$ of the gain error gradient.

FIG. 5

Figure 5:
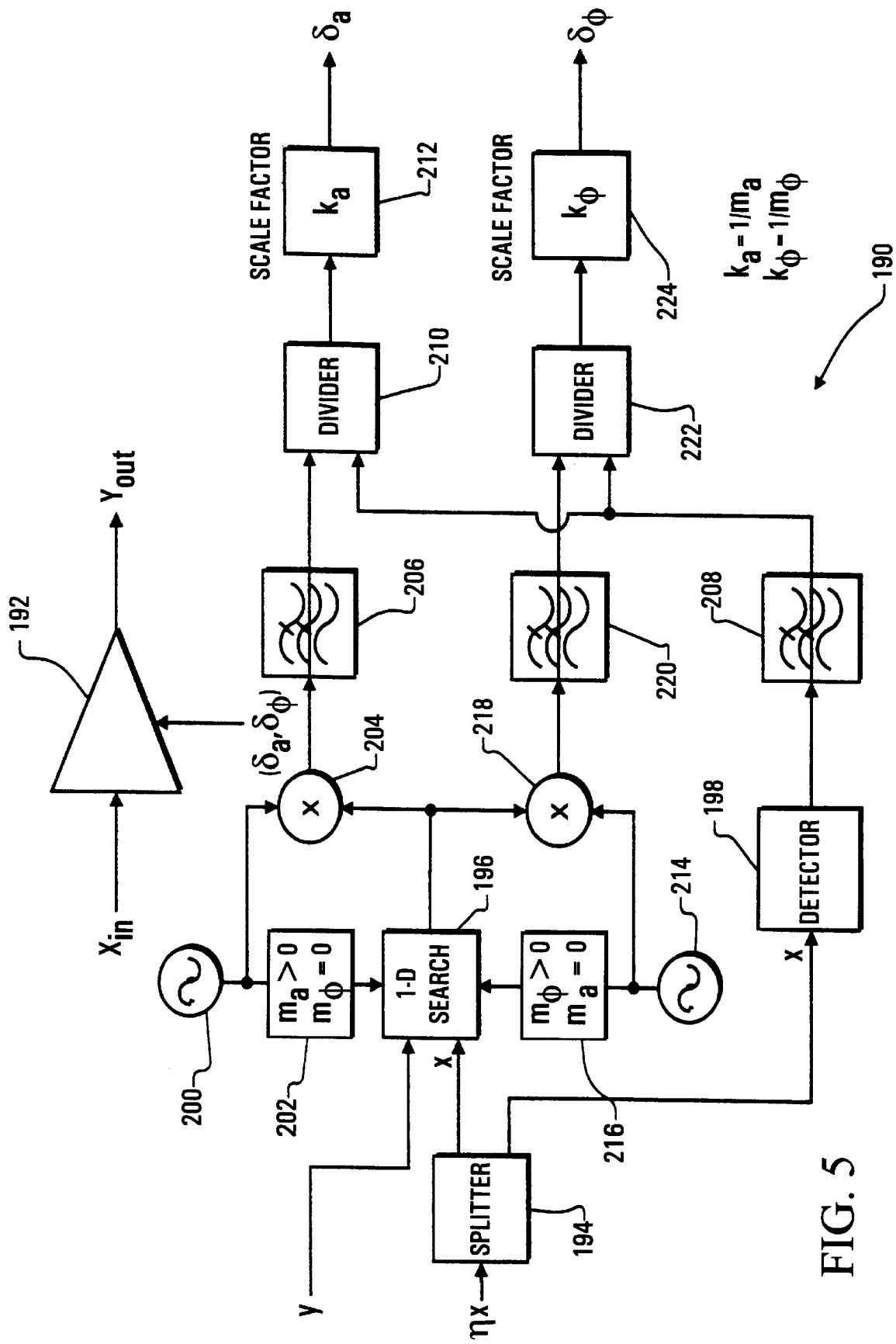
FIG. 5 is a schematic diagram of a gain error estimator according to a fifth embodiment of the invention, the embodiment including a frequency division multiplexed directional derivative estimator as shown in FIG. 2.

Referring now to FIG. 5, an error gradient estimator according to a fifth embodiment of the invention is generally illustrated at 190. The error gradient estimator 190 is connected to a vector modulated power amplifier 192 having a nominal gain $G_o$, an actual gain G, and being connected to receive an input signal $X_{in}$ and transmit an output signal $Y_{out}$.

It may be observed that the error gradient estimator 190 includes one directional derivative estimator as illustrated at 50 in FIG. 2. It may also be observed that waveform superposition permits the single directional derivative estimator to be frequency division multiplexed and to thereby simultaneously search two trajectories.

The error gradient estimator 190 is connected to the amplifier 192 through appropriate splitters, time delay loops, and attenuators as described in FIGS. 1 and 2 to receive a time delayed reference signal $x(t)=X_{in}(t-\tau)$ and an attenuated feedback signal $y=G_o^{-1} \cdot Y_{out}$. The error gradient estimator 190 is also connected to feedback to the amplifier 192 a gain modulating error signal $(\delta a, \delta \phi)$ that represents the gradient of the amplifier's complex gain error $(G/G_o)-1$.

In greater detail now, a two-way splitter 194 is connected to receive from the amplifier 192 the time delayed input signal x.

A one-dimensional search module 196 is connected to receive the time-delayed reference signal x from the two-way splitter 194 and the attenuated feedback signal y from the amplifier 192. The one-dimensional search module 196 is similar but not identical to the one illustrated at 67 in FIG. 2: it contains no internal scalar multipliers.

A square-law detector 198 is connected to the two-way splitter 194 to receive the time-delayed reference signal x.

The one-dimensional search module 196 and the square-law detector 198 are shared between two directional derivative estimators assembled according to the embodiment of FIG. 2.

The first directional derivative estimator includes, besides the one-dimensional search module 196 and the square-law detector 198, a first waveform source 200, an amplitude scalar multiplier 202, a first demodulator 204, a first lowpass filter 206, a second lowpass filter 208, and a first normalizing divider 210, and a second scalar multiplier 212 to form a first directional derivative estimate $\delta a$ aligned parallel to the amplitude axis.

The second directional derivative estimator includes, besides the one-dimensional search module 196 and the square-law detector 198, a second waveform source 214, a phase scalar multiplier 216, a second demodulator 218, a third lowpass filter 220, the second lowpass filter 208, a second normalizing divider 222, and a fourth scalar multiplier 224 to form a second directional derivative estimate $\delta \phi$ aligned parallel to the phase axis.

Thus the error gradient estimator 190 provides for searching at a first frequency for a first component of the best approximation of the directional derivative along a first bounded one-dimensional path in the phase amplitude space of the error signal and searching at a second frequency for a second component of the beat approximation of the directional derivative along a second bounded one-dimensional path in the phase amplitude space of the error signal.

FIG. 6

Figure 6:
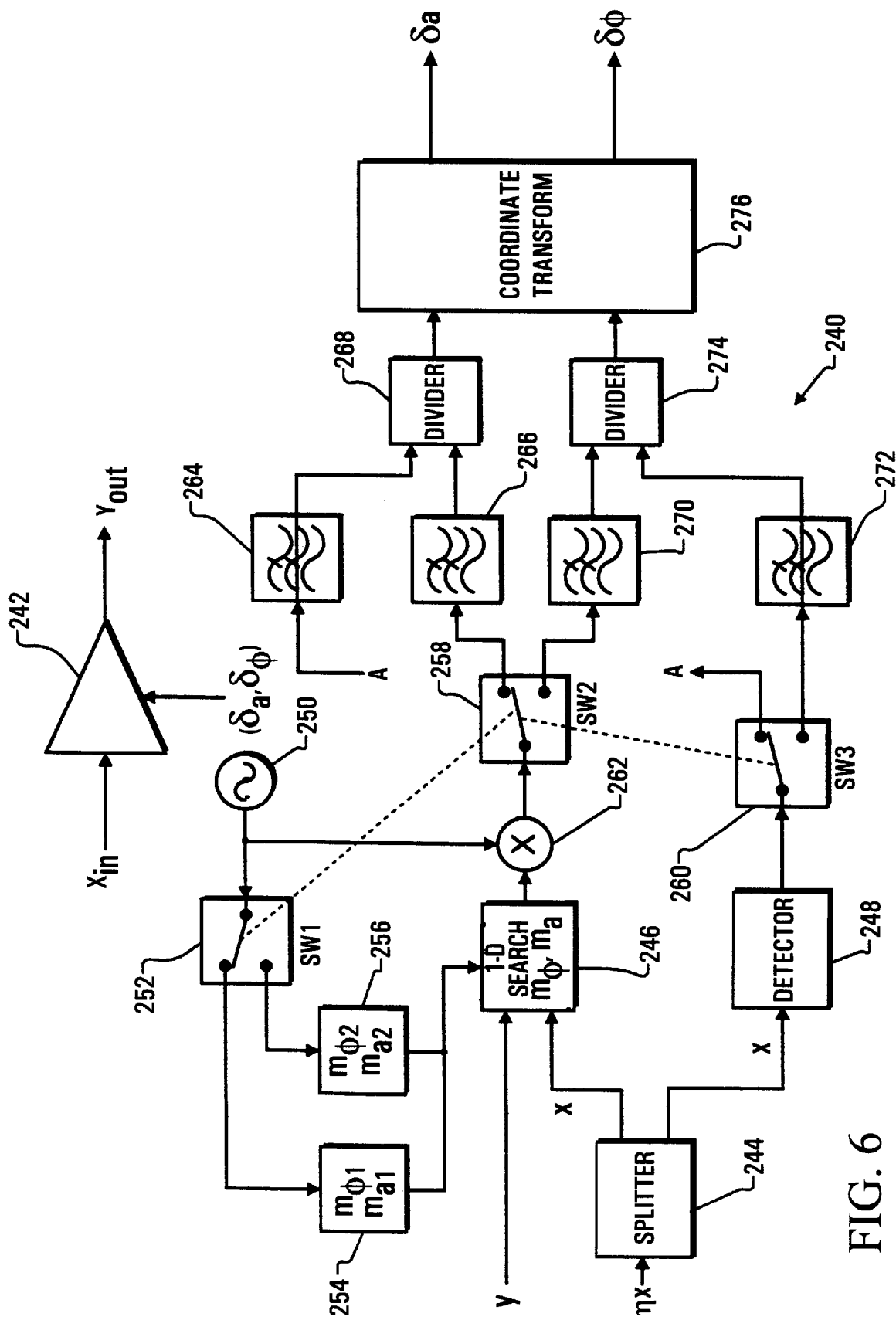
FIG. 6 is a schematic diagram of a gain error estimator according to a sixth embodiment of the invention, the embodiment including a time division multiplexed directional derivative estimator as shown in FIG. 2.

Referring now to FIG. 6, an error gradient estimator according to a sixth embodiment of the invention is generally illustrated at 240. The error gradient estimator 240 is connected to a vector modulated power amplifier 242 having a nominal gain $G_o$, an actual gain G, and being connected to receive an input signal $X_{in}$ and transmit an output signal $Y_{out}$.

It may be observed that the error gradient estimator 240 includes two directional derivative estimators as illustrated at 50 in FIG. 2, although the two estimators share a single processing path, including a single one-dimensional search module. It may also be observed that time division multiplexing permits the single one-dimensional search module alternately search each of the two trajectories.

The error gradient estimator 240 is connected to the amplifier 242 through appropriate splitters, time delay loops, and attenuators as described in FIGS. 1 and 2 to receive a time delayed reference signal $x(t)-X_{in}(t-\tau)$ and an attenuated feedback signal $y=G_o^{-1} \cdot Y_{out}$. The error gradient estimator 240 is also connected to feedback to the amplifier 242 a gain modulating error signal $(\delta a, \delta \phi)$ that represents the gradient of the amplifier's complex gain error $(G/G_o)-1$.

In greater detail now, a two-way splitter 244 is connected to receive from the amplifier 242 the time delayed input signal x.

A one-dimensional search module 246 is connected to receive the time-delayed reference signal x from the two-way splitter 244 and the attenuated feedback signal y from the amplifier 242. The one-dimensional search module 246 is similar but not identical to the one illustrated at 67 in FIG. 2: it contains no internal scalar multipliers A square-law detector 248 is connected to the two-way splitter 244 to receive the time-delayed reference signal x.

The one-dimensional search module 246 is connected to a waveform generator 250 through a first single pole, double throw switch 252 which alternately connects the one-dimensional search module 246 to either a first pair of external scalar multipliers 254 having preset search-trajectory constants $m_{\phi 1}$ and $m_{a1}$ or a second pair of external scalar multipliers 256 having preset search-trajectory constants $m_{\phi 2}$ and $m_{a2}$.

The error gradient estimator 240 further includes second and third single pole, double throw switches 258, 260. The three switches 252, 258, 260 are ganged together so that they throw simultaneously.

With the three switches 252, 258, 260 in a first position, a first directional derivative estimator is assembled according to the embodiment of FIG. 2 from the one-dimensional search module 246, the square-law detector 248, the waveform source 250, the first pair of scalar multipliers 254, a demodulator 262, a first lowpass filter 264, a second lowpass filter 266, and a first normalizing divider 268.

With the three switches 252, 258, 260 in a second position, a second directional derivative estimator is assembled according to the embodiment of FIG. 2 from the one-dimensional search module 246, the square-law detector 248, the waveform source 250, the second pair of scalar multipliers 256, the demodulator 262, a third lowpass filter 270, a fourth lowpass filter 272, and a second normalizing divider 274.

As in FIG. 4, a coordinate transform network 276 is connected to receive the signals output from the first and second normalizing dividers 274 and to generate the amplitude $\delta a$ and phase $\delta \phi$ components of the gain error gradient from the directional derivative values.

Thus the error gradient estimator 240 provides for searching for the best approximation of the directional derivative alternately along each of two substantially orthogonal bounded one-dimensional paths in the phase-amplitude space of the error signal.

While specific embodiments of the invention have been described and illustrated, such embodiments should be considered illustrative of the invention only and not as limiting the invention as construed in accordance with the accompanying claims.

What is claimed is:

1. A method of linearizing the vector gain of a power amplifier comprising:
   a. generating a directional derivative signal representing a phase-amplitude space directional derivative of an error signal of the power amplifier; and
   b. modulating the gain of the power amplifier in response to the directional derivative signal.

2. A method as claimed in claim 1 wherein generating a directional derivative signal further comprises locating in the phase-amplitude space of the error signal a vector that is substantially equal to the directional derivative.

3. A method as claimed in claim 2 wherein locating a vector that is substantially equal to the directional derivative further comprises searching for the best approximation of the directional derivative along a bounded one-dimensional path in the phase-amplitude space of the error signal.

4. A method as claimed in claim 2 wherein locating a vector that is substantially equal to the directional derivative further comprises searching for the best approximation of the directional derivative along a bounded one-dimensional path in the phase-amplitude space of the error signal, the path being parallel to the phase axis of the phase-amplitude space.

5. A method as claimed in claim 2 wherein locating a vector that is substantially equal to the directional derivative further comprises searching for the best approximation of the directional derivative along two bounded one-dimensional paths in the phase-amplitude space of the error signal.

6. A method as claimed in claim 2 wherein locating a vector that is substantially equal to the directional derivative further comprises searching for the best approximation of the directional derivative along two substantially orthogonal bounded one-dimensional paths in the phase-amplitude space of the error signal.

7. A method as claimed in claim 2 wherein locating a vector that is substantially equal to the directional derivative further comprises searching for the best approximation of the directional derivative alternately along each of two substantially orthogonal bounded one-dimensional paths in the phase-amplitude space of the error signal.

8. A method as claimed in claim 2 wherein locating a vector that is substantially equal to the directional derivative further comprises:
   a. searching for the best approximation of the directional derivative simultaneously along each of two substantially orthogonal bounded one-dimensional paths in the phase-amplitude space of the error signal; and
   b. combining into a weighted average the best approximation of the directional derivative along each of the two substantially orthogonal bounded one-dimensional paths.

9. A method as claimed in claim 2 wherein locating a vector that is substantially equal to the directional derivative further comprises:
   a. searching at a first frequency for a first component of the best approximation of the directional derivative along a first bounded one-dimensional path in the phase amplitude space of the error signal; and
   b. searching at a second frequency for a second component of the best approximation of the directional derivative along a second bounded one-dimensional path in the phase amplitude space of the error signal.

10. A method as claimed in claim 1, wherein generating a directional derivative signal further comprises:
    a. receiving a feedback signal corresponding to an output signal output from the power amplifier;
    b. receiving a reference signal corresponding to an input signal input to the power amplifier;
    c. modulating the phase of the reference signal through a bounded range of phase shift angles;
    d. subtracting the feedback signal from the modulated reference signal to produce a difference signal; and
    e. rectifying the difference signal to produce a rectified difference signal that corresponds to the magnitude of a directional derivative oriented parallel to the phase-amplitude space phase axis.

11. A method as claimed in claim 10 wherein receiving the feedback signal further comprises attenuating the output signal by the nominal gain of the amplifier.

12. A method as claimed in claim 11 wherein receiving the reference signal further comprises time delaying the input signal by the loop delay of the amplifier.

13. A method as claimed in claim 12 wherein generating the directional derivative signal further comprises demodulating the rectified difference signal to produce a demodulated difference signal.

14. A method as claimed in claim 13 wherein generating the directional derivative signal further comprises lowpass filtering the demodulated difference signal to produce a filtered difference signal.

15. A method as claimed in claim 14 wherein generating the directional derivative signal further comprises normalizing the filtered difference signal with respect to the instantaneous power of the reference signal to produce a normalized signal.

16. A method of as claimed in claim 1, wherein generating a directional derivative signal further comprises generating a gradient signal representing a phase-amplitude space gradient of the error signal of the power amplifier.

17. A method of as claimed in claim 16, wherein generating the gradient signal further comprises:
    a. receiving a feedback signal corresponding to an output signal output from the power amplifier;
    b. receiving a reference signal corresponding to an input signal input to the power amplifier;
    c. modulating the phase of the reference signal through a bounded range of phase shift angles;
    d. modulating the amplitude of the reference signal through a bounded range of amplitude shift levels;
    e. subtracting the feedback signal from the modulated reference signal to produce a difference signal; and
    f. rectifying the difference signal to produce a rectified difference signal that corresponds to the magnitude and phase of the gradient signal.

18. A method as claimed in claim 17 wherein receiving the feedback signal further comprises attenuating the output signal by the nominal gain of the amplifier.

19. A method as claimed in claim 18 wherein receiving the reference signal further comprises time delaying the input signal by the loop delay of the amplifier.

20. A method as claimed in claim 19 wherein generating the gradient signal further comprises demodulating the rectified difference signal to produce a demodulated difference signal.

21. A method as claimed in claim 20 wherein generating the gradient signal further comprises lowpass filtering the demodulated difference signal to produce a filtered difference signal.

22. A method as claimed in claim 21 wherein generating the gradient signal further comprises normalizing the filtered difference signal with respect to the instantaneous power of the reference signal to produce a normalized signal.

23. A method of as claimed in claim 16, wherein generating the gradient signal further comprises;
   a. receiving a feedback signal corresponding to an output signal output from the power amplifier;
   b. receiving a reference signal corresponding to an input signal input to the power amplifier;
   c. subtracting the magnitude of the feedback signal from the magnitude of the reference signal to produce an amplitude component of the gain error gradient;
   d. modulating the phase of the reference signal through a bounded range of phase shift angles;
   e. subtracting the feedback signal from the modulated reference signal to produce a difference signal; and
   f. rectifying the difference signal to produce a rectified difference signal that corresponds to a phase component of the gradient signal.

24. A method as claimed in claim 23 wherein receiving the feedback signal further comprises attenuating the output signal by the nominal gain of the amplifier.

25. A method as claimed in claim 24 wherein receiving the reference signal further comprises time delaying the input signal by the loop delay of the amplifier.

26. A method as claimed in claim 25 wherein generating the gradient signal further comprises demodulating the rectified difference signal to produce a demodulated difference signal.

27. A method as claimed in claim 20 wherein generating the gradient signal further comprises lowpass filtering the demodulated difference signal to produce a filtered difference signal.

28. A method as claimed in claim 21 wherein generating the gradient signal, further comprises normalizing the filtered difference signal with respect to the instantaneous power of the reference signal to produce a normalized signal.

29. The apparatus for linearizing the vector gain of a power amplifier comprising:
   a. means for generating a directional derivative signal representing a phase-amplitude space directional derivative of an error signal of the power amplifier; and
   b. means for modulating the gain of the power amplifier in response to the directional derivative signal.

30. The apparatus as claimed in claim 29 wherein the means for generating a directional derivative signal further comprises means for locating in the phase-amplitude space of the error signal a vector that is substantially equal to the directional derivative.

31. The apparatus as claimed in claim 30 wherein the means for locating a vector that is substantially equal to the directional derivative further comprises means for searching for the best approximation of the directional derivative along a bounded one-dimensional path in the phase-amplitude space of the error signal.

32. The apparatus as claimed in claim 30 wherein the means for locating a vector that is substantially equal to the directional derivative further comprises means for searching for the best approximation of the directional derivative along a bounded one-dimensional path in the phase-amplitude space of the error signal, the path being parallel to the phase axis of the phase-amplitude space.

33. The apparatus as claimed in claim 30 wherein the means for locating a vector that is substantially equal to the directional derivative further comprises means for searching for the best approximation of the directional derivative along two bounded one-dimensional paths in the phase-amplitude space of the error signal.

34. The apparatus as claimed in claim 30 wherein the means for locating a vector that is substantially equal to the directional derivative further comprises means for searching for the best approximation of the directional derivative along two substantially orthogonal bounded one-dimensional paths in the phase-amplitude space of the error signal.

35. The apparatus as claimed in claim 30 wherein the means for locating a vector that is substantially equal to the directional derivative further comprises means for searching for the best approximation of the directional derivative alternately along each of two substantially orthogonal bounded one-dimensional paths in the phase-amplitude space of the error signal.

36. The apparatus as claimed in claim 30 wherein the means for locating a vector that is substantially equal to the directional derivative further comprises:
   a. means for searching for the best approximation of the directional derivative simultaneously along each of two substantially orthogonal bounded one-dimensional paths in the phase-amplitude space of the error signal; and
   b. means for combining into a weighted average the best approximation of the directional derivative along each of the two substantially orthogonal bounded one-dimensional paths.

37. The apparatus as claimed in claim 30 wherein the means for locating a vector that is substantially equal to the directional derivative further comprises;
   a. means for searching at a first frequency for a first component of the best approximation of the directional derivative along a first bounded one-dimensional path in the phase amplitude space of the error signal; and
   b. means for searching at a second frequency for a second component of the beat approximation of the directional derivative along a second bounded one-dimensional path in the phase amplitude space of the error signal.

38. The apparatus as claimed in claim 29, wherein the means for generating a directional derivative signal further comprises:
   a. means for receiving a feedback signal corresponding to ail output signal output from the power amplifier;
   b. means for receiving a reference signal corresponding to an input signal input to the power amplifier;
   c. means for modulating the phase of the reference signal through a hounded range of phase shift angles;
   d. means for subtracting the feedback signal from the modulated reference signal to produce a difference signal; and
   e. means for rectifying the difference signal to produce a rectified difference signal that corresponds to the magnitude of a directional derivative oriented parallel to the phase-amplitude space phase axis.

39. The apparatus as claimed in claim 38 wherein the means for receiving the feedback signal further comprises means for attenuating the output signal by the nominal gain of the amplifier.

40. The apparatus as claimed in claim 39 wherein the means for receiving the reference signal further comprises means for time delaying the input signal by the loop delay of the amplifier.

41. The apparatus as claimed in claim 40 wherein the means for generating the directional derivative signal further comprises means for demodulating the rectified difference signal to produce a demodulated difference signal.

42. The apparatus as claimed in claim 41 wherein the means for generating the directional derivative signal further comprises means for lowpass filtering the demodulated difference signal to produce a filtered difference signal.

43. The apparatus as claimed in claim 42 wherein the means for generating the directional derivative signal further comprises means for normalizing the filtered difference signal with respect to the instantaneous power of the reference signal to produce a normalized signal.

44. The apparatus as claimed in claim 29, wherein the means for generating a directional derivative signal further comprises means for generating a gradient signal representing a phase-amplitude space gradient of the error signal of the power amplifier.

45. The apparatus as claimed in claim 44, wherein the means for generating the gradient signal further comprises:
   a. means for receiving a feedback signal corresponding to an output signal output from the power amplifier;
   b. means for receiving a reference signal corresponding to an input signal input to the power amplifier;
   c. means for modulating the phase of the reference signal through a bounded range of phase shift angles;
   d. means for modulating the amplitude of the reference signal through a bounded range of amplitude shift levels;
   e. means for subtracting the feedback signal from the modulated reference signal to produce a difference signal; and
   f. means rectifying the difference signal to produce a rectified difference signal that corresponds to the magnitude and phase of the gradient signal.

46. The apparatus as claimed in claim 45 wherein the means for receiving the feedback signal further comprises means for attenuating the output signal by the nominal gain of the amplifier.

47. The apparatus as claimed in claim 46 wherein the means for receiving the reference signal further comprises means for time delaying the input signal by the loop delay of the amplifier.

48. The apparatus as claimed in claim 47 wherein the means for generating the gradient signal further comprises means for demodulating the rectified difference signal to produce a demodulated difference signal.

49. The apparatus as claimed in claim 48 wherein the means for generating the gradient signal further comprises means for lowpass filtering the demodulated difference signal to produce a filtered difference signal.

50. The apparatus as claimed in claim 49 wherein the means for generating the gradient signal further comprises means for normalizing the filtered difference signal with respect to the instantaneous power of the reference signal to produce a normalized signal.

51. The apparatus as claimed in claim 44, wherein the means for generating the gradient signal further comprises:
   a. means for receiving a feedback signal corresponding to an output signal output from the power amplifier;
   b. means for receiving a reference signal corresponding to an input signal input to the power amplifier;
   c. means for subtracting the magnitude of the feedback signal from the magnitude of the reference signal to produce an amplitude component of the gain error gradient;
   d. means for modulating the phase of the reference signal through a bounded range of phase shift angles;
   e. means for subtracting the feedback signal from the modulated reference signal to produce a difference signal; and
   f. means for rectifying the difference signal to produce a rectified difference signal that corresponds to a phase component of the gradient signal.

52. The apparatus as claimed in claim 51 wherein the means for receiving the feedback signal further comprises means for attenuating the output signal by the nominal gain of the amplifier.

53. The apparatus as claimed in claim 52 wherein the means for receiving the reference signal further comprises means for time delaying the input signal by the loop delay of the amplifier.

54. Means as claimed in claim 53 wherein the means for generating the gradient signal further comprises means for demodulating the rectified difference signal to produce a demodulated difference signal.

55. The apparatus as claimed in claim 54 wherein the means for generating the gradient signal further comprises means for lowpass filtering the demodulated difference signal to produce a filtered difference signal.

56. The apparatus as claimed in claim 55 wherein the means for generating the gradient signal further comprises means for normalizing the filtered difference signal with respect to the instantaneous power of the reference signal to produce a normalized signal.

57. An apparatus for linearizing the vector gain of a power amplifier having an input terminal, an output terminal, and a gain control terminal, the apparatus comprising:
   a. a derivative signal generator comprising:
      i. a first input stage connected to the power amplifier input terminal to produce a reference signal corresponding to an input signal input to the power amplifier;
      ii. a second input stage connected to the power amplifier output terminal to produce a feedback signal corresponding to an output signal output from the power amplifier; and
      iii. an output stage connected to the power amplifier gain control terminal to provide a directional derivative signal representing a phase-amplitude space directional derivative of the power amplifier gain error.

58. An apparatus as claimed in claim 57 wherein the derivative signal generator further comprises a detector connected to the first and second input stages to detect in the phase-amplitude space of the error signal a vector that is substantially equal to the directional derivative.

59. An apparatus as claimed in claim 58 wherein the derivative signal generator further comprises a sweep circuit connected to the first and second input stages to search for the best approximation of the directional derivative along a bounded one-dimensional path in the phase-amplitude space of the error signal.

60. An apparatus as claimed in claim 58 wherein the derivative signal generator further comprises a sweep circuit connected to the first and second input stages to search for the best approximation of the directional derivative along a bounded one-dimensional path in the phase-amplitude space of the error signal, the path being parallel to the phase axis of the phase-amplitude space.

61. An apparatus as claimed in claim 58 wherein the derivative signal generator further comprises a sweep circuit connected to the first and second input stages to search for the best approximation of the directional derivative along two bounded one-dimensional paths in the phase-amplitude space of the error signal.

62. An apparatus as claimed in claim 58 wherein the derivative signal generator further comprises a sweep circuit connected to the first and second input stages to search for the best approximation of the directional derivative along two substantially orthogonal bounded one-dimensional paths in the phase-amplitude space of the error signal.

63. An apparatus as claimed in claim 58 wherein the derivative signal generator further comprises a sweep circuit connected to the first and second input stages to search for the best approximation of the directional derivative alternately along each of two substantially orthogonal bounded one-dimensional paths in the phase-amplitude space of the error signal.

64. An apparatus as claimed in claim 58 wherein the derivative signal generator further comprises:
   a. first and second sweep circuits connected to the first and second input stages to search for the best approximation of the directional derivative simultaneously along respectively first and second substantially orthogonal bounded one-dimensional paths in the phase-amplitude space of the error signal; and
   b. a Bumming junction connected to receiving the best approximation of the directional derivative from each of the first and second sweep circuits for combination into a weighted average.

65. An apparatus as claimed in claim 58 wherein the derivative signal generator further comprises:
   a. a first sweep circuit connected to the first and second input stages to search at a first frequency for a first component of the best approximation of the directional derivative along a first bounded one-dimensional path in the phase amplitude space of the error signal; and
   b. a second sweep circuit connected to the first and second input stages to search at a second frequency for a second component of the best approximation of the directional derivative along a second bounded one-dimensional path in the phase amplitude space of the error signal.

66. An apparatus as claimed in claim 57, wherein the derivative signal generator further comprises:
   a. a phase modulator connected to the first input stage to modulate the phase of the reference signal through a bounded range of phase shift angles;
   b. a subtracting junction connected to the second input stage and the phase modulator to subtract the feedback signal from the modulated reference signal to produce a difference signal; and
   c. a rectifier connected to the subtracting junction to rectify the difference signal to produce a rectified difference signal that corresponds to the magnitude of a directional derivative oriented parallel to the phase-amplitude space phase axis.

67. An apparatus as claimed in claim 66 wherein the second input stage further comprises an attenuator connected to the power amplifier output terminal to attenuate the output signal by the nominal gain of the amplifier.

68. An apparatus as claimed in claim 67 wherein the first input stage further comprises a time delay loop connected to the power amplifier input terminal to delay the input signal by the loop delay of the amplifier.

69. An apparatus as claimed in claim 68 wherein the derivative signal generator further comprises a demodulator connected to the rectifier to demodulate the rectified difference signal to provide a demodulated difference signal to the output stage.

70. An apparatus as claimed in claim 69 wherein the derivative signal generator further comprises a lowpass filter connected to the demodulator to filter the demodulated difference signal to provide a filtered difference signal to the output stage.

71. An apparatus as claimed in claim 70 wherein the derivative signal generator further comprises a normalizer connected to the lowpass filter to normalize the filtered difference signal with respect to the instantaneous power of the reference signal to provide a normalized signal to the output stage.

72. An apparatus as claimed in claim 57, wherein the derivative signal generator further comprises a gradient signal generator connected to generate a gradient signal representing a phase-amplitude space gradient of the error signal of the power amplifier.

73. An apparatus as claimed in claim 72, wherein the gradient signal generator further comprises:
   a. an amplitude modulator connected to the first input stage to modulate the amplitude of the reference signal through a bounded range of amplitude shift levels;
   b. a phase modulator connected to the amplitude modulator to modulate the phase of the amplitude-modulated reference signal through a bounded range of phase shift angles;
   c. a subtracting junction connected to the phase modulator and the second input stage to subtract the feedback signal from the modulated reference signal to produce a difference signal; and
   d. a rectifier connected to the subtracting junction to rectify the difference signal to provide to the output stage a rectified difference signal that corresponds to the magnitude and phase of the gradient signal.

74. An apparatus as claimed in claim 73 wherein the second input stage further comprises an attenuator connected to the power amplifier output terminal to attenuate the output signal by the nominal gain of the amplifier.

75. An apparatus as claimed in claim 74 wherein the first input stage further comprises a time delay loop connected to the power amplifier input terminal to delay the input signal by the loop delay of the amplifier.

76. An apparatus as claimed in claim 75 wherein the gradient signal generator further comprises a demodulator connected to the rectifier to demodulate the rectified difference signal to provide to the output stage a demodulated difference signal.

77. An apparatus as claimed in claim 76 wherein the gradient signal generator further comprises a lowpass filter connected to the demodulator to filter the demodulated difference signal to provide to the output stage a filtered difference signal.

78. An apparatus as claimed in claim 77 wherein the gradient signal generator further comprises a normalizer connected to the lowpass filter to normalize the filtered difference signal with respect to the instantaneous power of the reference signal to provide to the output stage a normalized signal.

79. An apparatus as claimed in claim 72, wherein the gradient signal generator further comprises:
   a. a first subtracting junction connected to the first and second input stages to subtract the magnitude of the feedback signal from the magnitude of the reference signal to produce an amplitude component of the gain error gradient;
   b. a phase modulator connected to the first input stage to modulate the phase of the reference signal through a bounded range of phase shift angles;
   c. a second subtracting junction connected to the phase modulator and the second input stage to subtract the feedback signal from the modulated reference signal to produce a difference signal; and d. a rectifier connected to the subtracting junction to rectify the difference signal to produce a rectified difference signal that corresponds to a phase component of the gradient signal.

80. An apparatus as claimed in claim 79 wherein the second input stage further comprises an attenuator connected to the power amplifier output terminal to attenuate the output signal by the nominal gain of the amplifier.

81. An apparatus as claimed in claim 80 wherein the first input stage further comprises a time delay loop connected to the power amplifier input terminal to delay the input signal by the loop delay of the amplifier.

82. An apparatus as claimed in claim 81 wherein the gradient signal generator further comprises a demodulator connected to the rectifier to demodulate the rectified difference signal to provide to the output stage a demodulated difference signal.

83. An apparatus as claimed in claim 82 wherein the gradient signal generator further comprises a lowpass filter connected to the demodulator to filter the demodulated difference signal to provide to the output stage a filtered difference signal.

84. An apparatus as claimed in claim 83 wherein the gradient signal generator further comprises a normalizer connected to the lowpass filter to normalize the filtered difference signal with respect to the instantaneous power of the reference signal to produce a normalized signal.

* * * * *

UNITED STATES PATENT AND TRADEMARK OFFICE
CERTIFICATE OF CORRECTION

PATENT NO. : 6,232,835 B1  
DATED : May 15, 2001  
INVENTOR(S) : Richard Neil Braithwaite It is certified that error appears in the above-identified patent and that said Letters Patent is hereby corrected as shown below:

Column 15,  
Line 41, delete the first occurrence of "The" and substitute -- An -- therefor.

Column 16,  
Line 32, delete ";" and substitute -- : -- therefor.  
Line 38, delete "beat" and substitute -- best -- therefor.  
Line 45, delete "ail" and substitute -- an -- therefor.  
Line 50, delete "hounded" and substitute -- bounded -- therefor.

Column 18,  
Line 15, delete the first occurrences of "Means" and substitute -- The apparatus -- therefor.

Column 19,  
Line 21, delete "Bumming" and substitute -- summing -- therefor.

Signed and Sealed this

Twenty-eighth Day of May, 2002

Attest:

JAMES E. ROGAN  
*Attesting Officer*  *Director of the United States Patent and Trademark Office*